United States Patent [19]

Maley et al.

[11] 4,439,690
[45] Mar. 27, 1984

[54] THREE-GATE HAZARD-FREE POLARITY HOLD LATCH

[75] Inventors: Gerald A. Maley, Fishkill; Raymond H. Warren, Gardiner; Douglas W. Westcott, Wappingers Falls, all of N.Y.

[73] Assignee: International Business Machines Corporation, Armonk, N.Y.

[21] Appl. No.: 371,891

[22] Filed: Apr. 26, 1982

[51] Int. Cl.³ .................... H03K 3/037; H03K 19/20; H03K 17/04
[52] U.S. Cl. .......................... 307/272 R; 307/247 R; 307/480; 307/289
[58] Field of Search ............... 307/289, 290, 291, 454, 307/455, 456, 466, 467, 475, 480, 440, 445, 443, 601, 272 R

[56] References Cited

U.S. PATENT DOCUMENTS

| | | | |
|---|---|---|---|
| 3,603,815 | 9/1971 | Rao | 307/289 X |
| 3,740,590 | 6/1973 | Hart et al. | 307/480 X |
| 4,160,173 | 7/1979 | Aoki | 307/291 X |
| 4,283,640 | 8/1981 | Konian et al. | 307/454 X |
| 4,374,331 | 2/1983 | Yamamoto et al. | 307/291 |

OTHER PUBLICATIONS

Gates et al., "Set/Reset Shift Register Latch", IBM Tech. Discl. Bull., vol. 21, No. 10, pp. 4166, Mar. 1979.

*Primary Examiner*—Larry N. Anagnos
*Assistant Examiner*—David R. Bertelson
*Attorney, Agent, or Firm*—Robert J. Haase

[57] ABSTRACT

A hazard-free latch is disclosed comprising three NAND logic gates, one of the gates, in combination with its output loading, being relatively fast and another of the gates, in combination with its output loading, being relatively slow. Both gates receive an input clock signal. Input data is applied to the third gate. The output of the fast gate is connected to another input of the slow gate. The outputs of the third and the slow gates are connected to an output terminal and to another input of the fast gate.

6 Claims, 2 Drawing Figures

THREE-GATE HAZARD-FREE POLARITY HOLD LATCH

BACKGROUND OF THE INVENTION

1. Field of the Invention

The invention generally relates to polarity hold latches and, more particularly, to such a latch characterized by circuit simplicity, high speed and hazard free operation.

2. Description of the Prior Art

It has long been recognized that many benefits follow from successful efforts to eliminate unnecessary or redundant logic components from a given circuit. Redundant logic slows the speed of the machine in which it is used because each component introduces delay. Redundant logic increases the probability of component failure. Substantial cost savings can be realized in eliminating redundant logic, especially in applications where there is wide repetitive use of the simplified circuits.

Of course, circuit simplification should be achieved without compromising circuit stability or performance. In the case of the polarity hold latch, for example, efforts to reduce the number of logic components in an existing four-NAND gate latch must be cognizant of the need to substantially maintain the fast switching speed with which the latch can be set to the value of the input data line when the input control gate line is raised to a "1". In particular, techniques such as the addition of capacitive delay to avoid instability in the simplified circuit are undesirable because of the consequent worsened circuit response time. On the other hand, it is permissible to sacrifice an inconsequential performance characteristic, such as latch minimun reactivation interval, where the circuit application permits.

SUMMARY OF THE INVENTION

By taking advantage of the delay relationships in an LSI chip having relatively higher speed and relatively lower speed logic gates, an electrically hazard free three-gate polarity hold latch is constructed using both gate types. Several ways are shown to guarantee that one gate is faster than a second gate in the three-gate latch. Preferably, a pair of fast gates inherently having mutually different response times are employed. Thus, neither circuit is deliberately slowed by the addition of any extraneous components introduced for that purpose.

DESCRIPTION OF THE PREFERRED EMBODIMENTS

Figure 1:
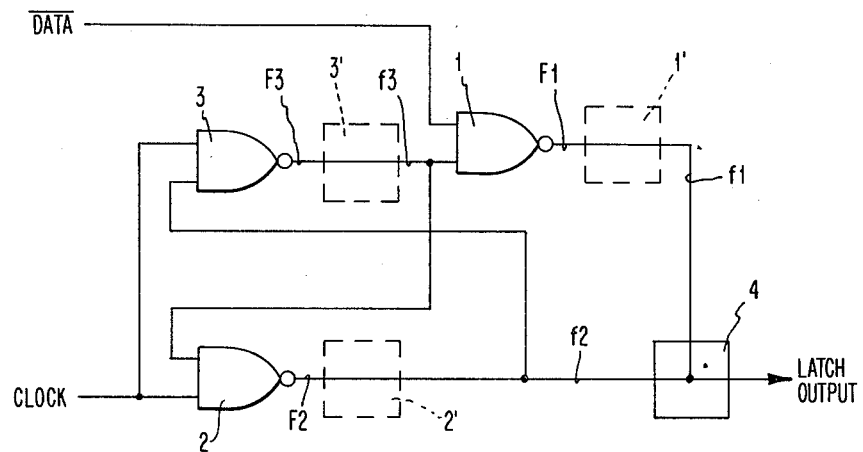
FIG. 1 is a schematic circuit of a single port embodiment of the present invention.

The simplified polarity hold latch of FIG. 1 comprises three NAND logic gates rather than four NAND gates of the prior art such as shown on page 259 of the book "The Logic Design of Transistor Digital Computers", by Gerald Maley and John Earle, Prentice Hall, 1963. The simplified latch eliminates the need for special clock drivers and clock relationships without sacrificing switching time response to individual input data changes. However, there is some added delay in the recovery time in which the latch can respond to successive input data changes. The latter delay increase is of no consequence in buffer register uses, for example of the simplified latch where new data normally is held longer than said recovery time.

Each NAND gate in the latch of FIG. 1 has a plurality of inputs and one output. Gates 2 and 3 constitute the latch per se while gate 1 is the data input gate to the latch. When data is to be written into the latch, the clock becomes active by raising the clock line. This deactivates gate 2, forcing its output to a "zero" state. This allows the DATA line to be gated into the latch causing the output of the latch to be inverted from the data. Deactivating the clock by lowering the CLOCK line saves the state of the latch by deactivating gate 1 and activating gate 3 as the controlling term in the latch. The data in the latch is valid only if gate 3 returns to its proper state prior to gate 2 returning to its proper state. This timing requirement insures that the hazard present if the output is to be latched at a "zero" state is avoided.

There are several ways to guarantee that gate 3 is faster than in a VLSI environment. One way is to use a higher power device for gate 3. A second way is the loading on the outputs of the gates, e.g., gate 3 has a load of two inputs (to gates 1 and 2), gate 2 has a load of one input (to gate 3) plus a dot AND 4 plus any loads on the latch output. Either or both of these can guarantee the timing relationships required. A third alternative is to delay the CLOCK line going to gate 2 to be after the CLOCK line going to gate 3. A fourth and preferred way is to use a higher speed circuit for gate 3 and a slower speed circuit for gate 2.

A suitable bipolar logic circuit for gate 3, characterized by low standby power dissipation and fast response, is described in U.S. Pat. No. 4,283,640, for All-NPN Transistor Driver and Logic Circuit, issued to Konian et al. on Aug. 11, 1981 and assigned to the present assignee. Although the patent describes the logic circuit as a NOR circuit, it will be noted that the NAND operation is achieved simply by inverting the definition of "up" voltage level as representing a binary "zero" instead of a binary "one" in the latch configuration design. Thus, the latch of FIG. 1 can be implemented with three NAND gates and a dot AND or with three NOR gates and a dot OR.

Conventional current switch emitter follower technology is suitable for implementing gates 1 and 2. Dot AND gate 4 simply is the common collector connection between the outputs of bipolar NAND gates 1 and 2.

The operation of the latch of FIG. 1 is completely depicted in the excitation matrix below. For the sake of analysis, each of the gates 1, 2 and 3 are assumed to be ideal with no internal delay. The inherent delay in the real gate circuits is represented by the respective dotted boxes 1', 2', and 3'.

| f1f2f3 \ D,C | 00 | 01 | 11 | 10 |
|---|---|---|---|---|
| 000 | F₁F₂F₃ 1 1 1 | 1 1 1 | 1 1 1 | 1 1 1 |
| 001 | 1 1 1 | 1 0 1 | [0 0 1] | 0 1 1 |
| 011 | 1 1 1 | 1 0 1 | 0 0 1 | [0 1 1] |
| 010 | 1 1 1 | 1 1 1 | 1 1 1 | 1 1 1 |
| 100 | 1 1 1 | 1 1 1 | 1 1 1 | 1 1 1 |
| 101 | 1 1 1 | [1 0 1] | 0 0 1 | 0 1 1 |
| 111 | [1 1 1] | 1 0 0 | 0 0 0 | 0 1 1 |
| 110 | 1 1 1 | [1 1 0] | [1 1 0] | 1 1 1 |

EXCITATION MATRIX

In the excitation matrix, $F_1$, $F_2$ and $F_3$ are the respective inputs to delays $1'$, $2'$ and $3'$ whereas $f_1$, $f_2$ and $f_3$ are the respective outputs from delays $1'$, $2'$ and $3'$. The latch is stable whenever $F_1$, $F_2$ and $F_3$ have the same values as $f_1$, $f_2$ and $f_3$. The six instances where this is true are enclosed in rectangles in the excitation matrix.

As an example of the manner in which the excitation matrix represents the operation of the latch of FIG. 1, consider the case of rectangle 5. In that case, $D=1$, $C=1$, $f_1f_2f_3=001$ and $F_1F_2F_3=001$. Consequently, the latch is at a stable operating point. Now, if the value of D is changed to zero, the circuit operation point moves one column to the left in the same row of the matrix at which point $F_1F_2F_3=101$. The latch becomes momentarily unstable ($f_1f_2f_3 \neq F_1F_2F_3$) and the operating point moves vertically along the column to the position of rectangle 6 where $f_1f_2f_3=F_1F_2F_3=101$. The circuit again becomes stable.

All of the other stable and unstable operating points represented in the matrix can be understood and followed by application of the two simple rules that (1) changes in the inputs D and C cause horizontal movement along the rows of the matrix whereas (2) circuit operation in response to input changes causes vertical movement along the columns of the matrix.

Figure 2:
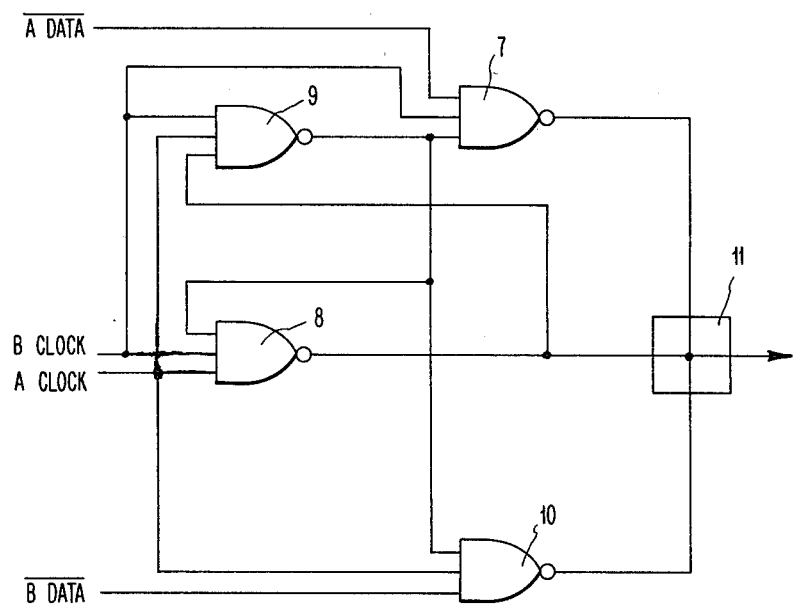
FIG. 2 is a schematic diagram of a two port extension of the embodiment of FIG. 1.

FIG. 2 represents a two ported variation of the latch of FIG. 1. Gates 7, 8 and 9 serve the same function as gates 1, 2 and 3 in the single port latch. Gate 10 becomes the data entry point for the second port. The restriction on the latch is that only one port may write the latch at any point in time. All the discussion that applied to the speed of the devices is still applicable in this case. The dot AND function in this device is the three way dot 11 rather than a two way which helps the timing relationship requirements. One salient feature of this latch, as well as the latch of FIG. 1, is that it does not require clocks with special timing requirements and thus special clock drivers.

We claim:
1. A latch comprising
   three logic gates, each having a plurality of inputs and one output,
   one of said gates in combination with its output loading being relatively faster in operation than a second of said gates in combination with its output loading,
   one input of said one and said second gates being connected to receive a clock input,
   the output of said one gate being connected to one input of a third of said gates and to another input of said second gate, another input of said third gate being connected to receive a data input,
   the output of said third and said second gates being connected to an output terminal,
   and
   the output of said second gate being connected to another input of said first gate.
2. The latch defined in claim 1 wherein said three gates are NAND gates and said outputs of said third and said second gates are connected via a dot AND to said output terminal.
3. The latch defined in claim 1 wherein said three gates are NOR gates and said outputs of said third and said second gates are connected via a dot OR to said output terminal.
4. The latch defined in claim 1 and further including a fourth logic gate having a plurality of inputs and one output,
   the output of said fourth gate being connected to said output terminal,
   one input of said fourth gate being connected to receive a second data input,
   a second input of said fourth gate being connected to the output of said one gate,
   a third input of said fourth gate being connected to receive said clock input, and
   a third input of said first, second and third gates being connected to receive a second clock signal.
5. The latch defined in claim 4 wherein said four gates are NAND gates and said outputs of said fourth, said third and said second gates are connected via a dot AND to said output terminal.
6. The latch defined in claim 4 wherein said four gates are NOR gates and said outputs of said fourth, said third and said second gates are connected via a dot OR to said output terminal.

* * * * *